(12) United States Patent
Elian et al.

(10) Patent No.: US 9,818,665 B2
(45) Date of Patent: Nov. 14, 2017

(54) METHOD OF PACKAGING A SEMICONDUCTOR CHIP USING A 3D PRINTING PROCESS AND SEMICONDUCTOR PACKAGE HAVING ANGLED SURFACES

(71) Applicant: Infineon Technologies AG, Neubiberg (DE)

(72) Inventors: Klaus Elian, Alteglofsheim (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 398 days.

(21) Appl. No.: 14/193,480

(22) Filed: Feb. 28, 2014

(65) Prior Publication Data

US 2015/0249043 A1 Sep. 3, 2015

(51) Int. Cl.
  H01L 23/31 (2006.01)
  B29C 67/00 (2017.01)
  H01L 21/56 (2006.01)
  B29C 70/72 (2006.01)
  B33Y 80/00 (2015.01)
  (Continued)

(52) U.S. Cl.
  CPC ...... *H01L 23/3135* (2013.01); *B29C 67/0051* (2013.01); *B29C 67/0055* (2013.01); *B29C 70/72* (2013.01); *B33Y 40/00* (2014.12); *B33Y 80/00* (2014.12); *B81C 1/00309* (2013.01); *H01L 21/4867* (2013.01); *H01L 21/56* (2013.01); *H01L 23/315* (2013.01); *H01L 23/3121* (2013.01); *B29K 2025/08* (2013.01); *B29K 2033/04* (2013.01); *B29K 2105/253* (2013.01); *B29L 2031/3481* (2013.01); *B81C 2203/0136* (2013.01); *H01L 2224/48091* (2013.01); *H01L 2224/48227* (2013.01); *H01L 2224/48465* (2013.01); *H01L 2224/49113* (2013.01); *H01L 2924/00014* (2013.01);
  (Continued)

(58) Field of Classification Search
  CPC . H01L 2924/01079; H01L 2924/01078; H01L 2924/01029; H01L 2924/14; H01L 21/288; H01L 21/2885; H01L 21/76843; H01L 21/76849; H01L 21/76874; H01L 23/31; H01L 23/313; H01L 23/3135; H01L 23/312; H01L 23/3121; H01L 23/315
  USPC .......................... 438/678; 257/674, 390, 684
  See application file for complete search history.

(56) References Cited

U.S. PATENT DOCUMENTS 6,997,698 B2 2/2006 Silverbrook
2004/0070061 A1 4/2004 Grigg
(Continued)

FOREIGN PATENT DOCUMENTS

AU 2004214604 A1 10/2004
CN 101539250 A 9/2009
(Continued)

*Primary Examiner* — Monica D Harrison
(74) *Attorney, Agent, or Firm* — Murphy, Bilak & Homiller, PLLC

(57) ABSTRACT

In one aspect, a method of packaging a semiconductor module includes providing a semiconductor module having a first surface, a second surface opposite the first surface and edge sides extending between the first surface and the second surface. A packaging assembly is formed at least partly by a 3D printing process. The packaging assembly includes the semiconductor module and a protective covering that extends over the first surface.

4 Claims, 11 Drawing Sheets

(51) Int. Cl.
    *B33Y 40/00*         (2015.01)
    *B81C 1/00*         (2006.01)
    *H01L 21/48*        (2006.01)
    *B29K 25/00*         (2006.01)
    *B29K 33/04*         (2006.01)
    *B29K 105/00*       (2006.01)
    *B29L 31/34*         (2006.01)

(52) U.S. Cl.
    CPC ............... *H01L 2924/16152* (2013.01); *H01L 2924/181* (2013.01); *H01L 2924/1815* (2013.01)

(56) References Cited

U.S. PATENT DOCUMENTS

| | | |
|---|---|---|
| 2005/0167795 A1 | 8/2005 | Higashi |
| 2007/0020814 A1 | 1/2007 | Hembree et al. |
| 2008/0283180 A1 | 11/2008 | Bachman et al. |
| 2009/0151972 A1 | 6/2009 | Potter |
| 2013/0032936 A1 | 2/2013 | Formosa |
| 2014/0146497 A1* | 5/2014 | Wang ................... H01L 23/3121 361/760 |
| 2015/0200180 A1* | 7/2015 | Fam ........................ H01L 24/83 257/415 |
| 2015/0236076 A1* | 8/2015 | Sim ..................... H01L 27/3218 257/40 |

FOREIGN PATENT DOCUMENTS

| | | |
|---|---|---|
| CN | 101823683 A | 9/2010 |
| CN | 103327741 A | 9/2013 |
| CN | 103517190 A | 1/2014 |
| DE | 102005053765 A1 | 5/2007 |
| DE | 102014201121 A1 | 7/2015 |
| EP | 1457099 B1 | 6/2005 |
| WO | 03058677 A3 | 7/2003 |
| WO | 2009034557 A2 | 3/2009 |
| WO | 2013030064 A1 | 3/2013 |

\* cited by examiner

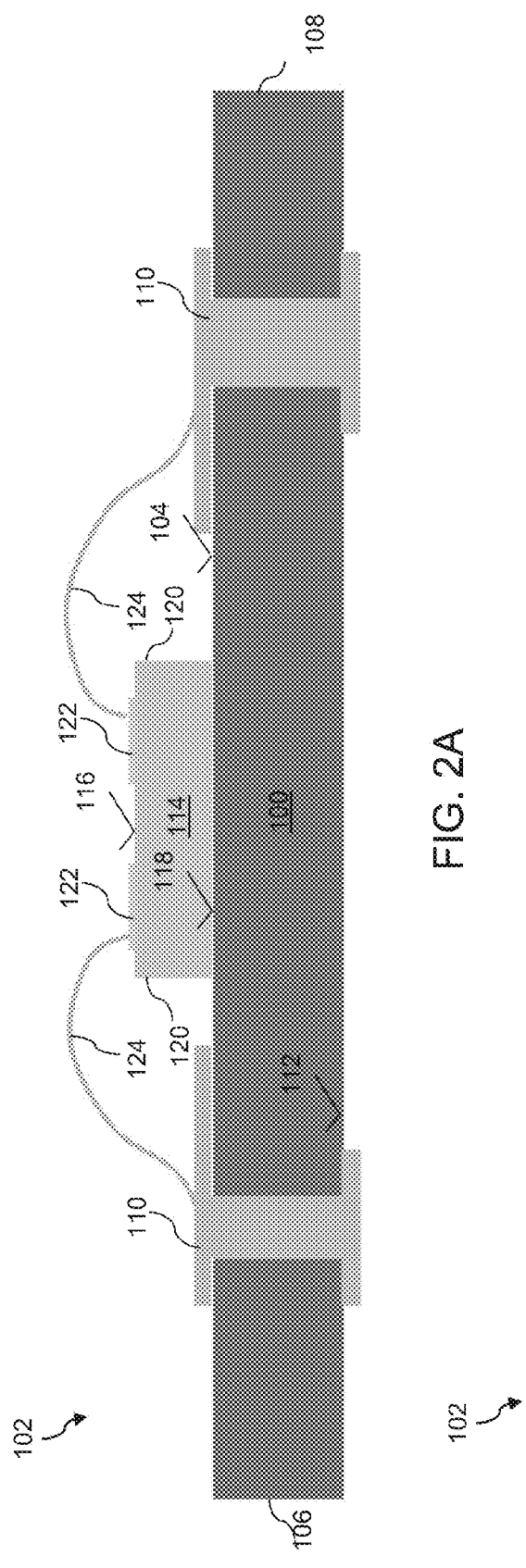
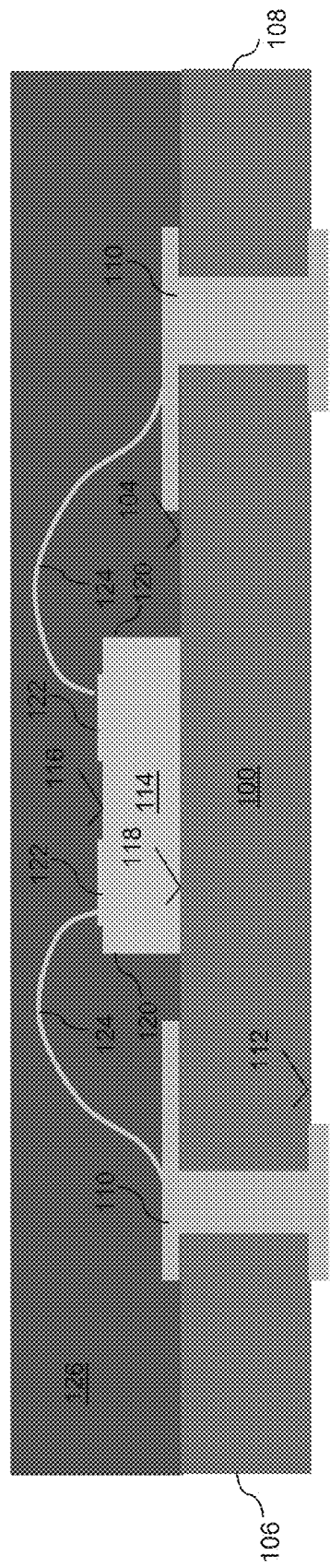
FIG. 2A
FIG. 2B

METHOD OF PACKAGING A SEMICONDUCTOR CHIP USING A 3D PRINTING PROCESS AND SEMICONDUCTOR PACKAGE HAVING ANGLED SURFACES

TECHNICAL FIELD

The present invention generally relates to semiconductor packaging, and particularly relates to methods of forming negative tapers and retrograde surfaces in a semiconductor package using a 3D printing process.

BACKGROUND

In many integrated circuit applications, semiconductor chips are arranged in a packaging assembly. A packaging assembly allows for an electrical connection between the semiconductor chip and other devices via a printed circuit board, for example. Additionally, a packaging assembly protects the chip and the electrical connections from damage. Depending on the application, the packaging assembly may be exposed to potentially damaging environmental conditions, such as extreme temperature variations, high amounts of moisture and dust particles. For this reason, packaging assemblies include a protective covering that covers the semiconductor chip and the electrical connections. The protective covering is formed from a durable material to provide a robust seal that repels moisture and particles.

Packaging assemblies for MEMs (micro-electromechanical systems) technology require additional design considerations. In MEMs technology, a sensor device having a cantilever shape (i.e. anchored at only one end) is commonly arranged on the surface of the semiconductor chip. The sensor device may be used to measure environmental parameters such as, temperature, pressure, sound, composition of atmosphere, acceleration, etc. Thus, while the rest of the assembly may require protection from the exterior environment, these sensors require at least partial exposure to the exterior environment to measure these environmental parameters. Accordingly, a packaging structure in a MEMs application may require an opening in the protective covering to expose the MEMs sensor device.

The dual goal of exposing a MEMs sensor device to the exterior environment while protecting the rest of the components is not ideally accommodated by known packaging techniques. One known packaging technique involves molding a protective covering around the semiconductor chip. An encapsulant material is poured into a mold cavity and hardened. However, this technique is limited with respect to the kinds of shapes that can be formed. For instance, certain angles and corners may not be possible because the encapsulant hardens before it reaches the point of the mold cavity corresponding to the desired shape.

SUMMARY

According to one embodiment, a method of packaging a semiconductor module is disclosed. The method includes providing a semiconductor module having a first surface, a second surface opposite the first surface and edge sides extending between the first surface and the second surface. A packaging assembly is formed at least partly by a 3D printing process. The packaging assembly includes the semiconductor module and a protective covering that extends over the first surface.

According to another embodiment, a semiconductor packaging assembly is disclosed. The semiconductor packaging assembly includes a substrate having a mounting surface. The semiconductor packaging assembly further includes a first semiconductor module having a first surface, a second surface opposite the first surface and edge sides extending between the first surface and the second surface. The semiconductor module is arranged on the substrate such that the second surface faces the mounting surface. The semiconductor packaging assembly further includes a protective covering extending over first surface. The protective covering adjoins the mounting surface and the first surface and has opposing sidewalls that extend towards the mounting surface. The opposing sidewalls have a negative taper.

According to another embodiment, a semiconductor packaging assembly is disclosed. The semiconductor packaging assembly includes a first semiconductor module having a first surface, a second surface opposite the first surface and edge sides extending between the first surface and the second surface. The semiconductor packaging assembly further includes a protective covering adjoining the first surface at a first location and a second location. Each of the first and second are spaced apart from the edge sides of the semiconductor module such that portions of the first surface adjacent the edge sides are exposed from the protective covering. A first MEMs device is arranged on the first surface between the first and second locations Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1 including

FIG. 2 including FIGS. 2A-2B depicts a packaging assembly having a semiconductor module arranged on the substrate and a protective covering extending over the semiconductor module, according to an embodiment.

FIG. 9 including

DETAILED DESCRIPTION

Embodiments described herein provide a method of producing a packaging assembly and a corresponding packaging assembly structure. The methods described herein involve the usage of a 3D printing process. 3D printing offers numerous advantages over conventional package production methods.

One notable advantage of the embodiments disclosed herein is the formation of angled surfaces in a packaging structure that are not possible or difficult to achieve by conventional package formation processes. In particular, the presently disclosed methods utilize 3D printing to produce protective structures having a negative taper and/or a retrograde shape. Negative tapers and retrograde shapes may be particularly advantageous for packaging in MEMs applications. A protective covering with a negative taper or retrograde shape can be arranged over a MEMs device in a way that the protective covering exposes the MEMs device to the exterior environment while substantially protecting the chip assembly. Negative tapers and retrograde shapes are difficult or impossible to achieve by a conventional molding process. A mold tool with a cavity having angled surfaces corresponding to these negative tapers and retrograde shapes must be used. In such a mold cavity, mold compound forms at the angled surfaces corresponding to negative tapers and retrograde shapes cannot be removed from the mold cavity. This is because the hardened mold compound now serves as solid plug that fits perfectly in the negative tapers of the mold tool and prevents opening of the mold tool. The embodiments described herein overcome this problem by replacing the molded structure by a 3D printed structure or by combining a 3D printed structure with an overmold structure.

Another notable advantage of the embodiments disclosed herein is the simplification of the packaging process. Conventionally, a three dimensional packaging structure, such as a protective covering that surrounds a semiconductor module, is formed exclusively by a molding process. Molding involves the numerous process steps of forming a mold cavity, depositing viscous material in the cavity, hardening the material and removing the mold. In contrast, the 3D printing process described herein is utilized to directly form a three dimensional packaging structure on or around a semiconductor module in a single, continuous step.

Figure 1A:
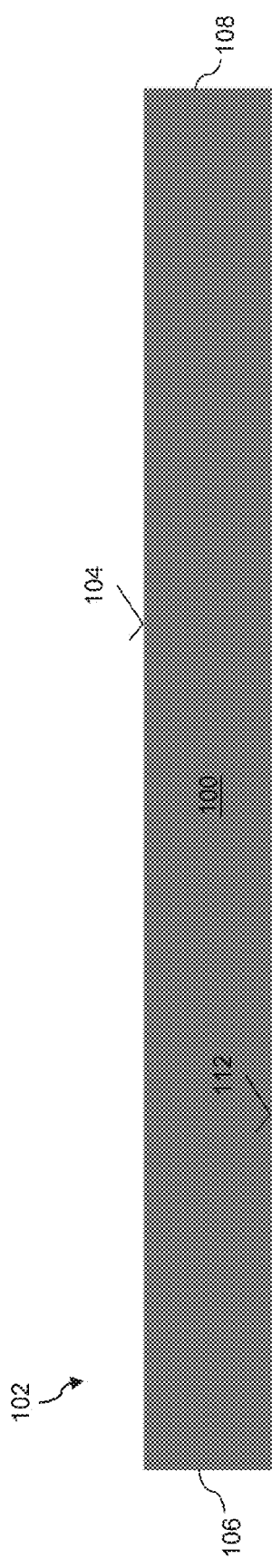
FIGS. 1A-1B depicts a substrate that may be used in a packaging assembly, according to an embodiment.
Figure 1B:
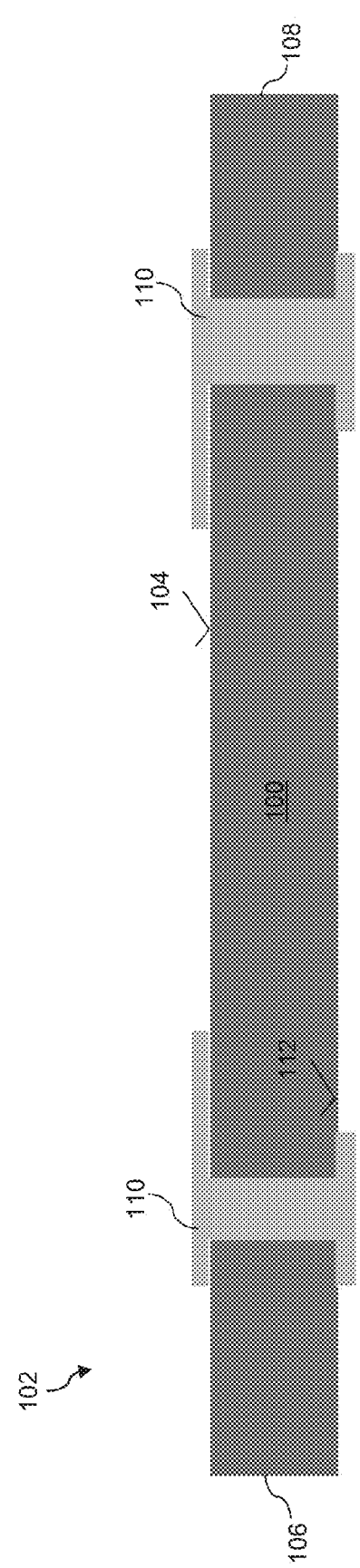

FIG. 1 depicts a substrate 100 that may be used in a packaging assembly 102, according to an embodiment. The substrate 100 includes a substantially planar mounting surface 104 extending between a first substrate edge 106 and a second substrate edge 108 that is opposite the first substrate edge 106. As shown in FIG. 1B, a plurality of conductive contact pads 110 is formed on the mounting surface 104. The conductive contact pads 110 are sufficiently spaced apart from one another such that a semiconductor module can be arranged between the conductive contact pads 110. The conductive contact pads 110 may extend through the semiconductor substrate 100 to a bottom surface 112 that is opposite the mounting surface 104.

FIG. 2 depicts a semiconductor module 114 arranged on the substrate 100 of FIG. 1 in a protective covering and electrically connected to the substrate 100, according to an embodiment. The semiconductor module 114 includes a first surface 116, a second surface 118 opposite the first surface 116 and edge sides 120 extending between the first surface 116 and the second surface 118. The semiconductor module 114 may be any kind of integrated circuit device, such as a power switching device, MEMs device, microprocessor, FPGA, etc. The semiconductor module 114 may contain one or a plurality of individual semiconductor chips integrated in a single casing.

As shown in FIG. 2A, the semiconductor module 114 is arranged on the mounting surface 104 between the conductive contact pads 110 such that the second surface 118 faces the mounting surface 104. The semiconductor module 114 has external connection terminals 122 arranged on the first surface 116. Conductive wires 124 electrically connect the conductive contact pads 110 to the semiconductor module 114. As shown in FIG. 2B, a protective covering 126 is arranged on the substrate 100. The protective covering 126 extends over the first surface 116. According to an embodiment, the protective covering 126 directly adjoins both the substrate 100 and the semiconductor module 114 and completely covers both the mounting surface 104 and the first surface 116. The protective covering 126 adjoins the mounting surface 104 on opposite sides 120 of the semiconductor module 114. The semiconductor module 114, the protective covering 126 that extends over the first surface 116, the substrate 100, the conductive contact pads 110 and the conductive wires 124 collectively form a packaging assembly 102, according to an embodiment.

Any one or all of the components in the packaging assembly 102 of FIG. 2B, with the exception of the semiconductor module 114, may be formed by a 3D printing process. That is, the substrate 100, the conductive contact pads 110, the conductive wires 124 and the protective covering 126 that extends over the first surface 116 may be formed by a 3D printing process. The semiconductor module 114 may be manufactured separately according to known methods. Further, differently arranged packaging assemblies (not shown) may be formed by the 3D printing process. For instance, a flip chip packaging assembly 102 in which the second surface 118 includes conductive terminals that directly electrically connect with conductive bonding pads on the substrate 100 may be produced. Further, the packaging assembly 102 may include multiple semiconductor modules 114 arranged on the mounting surface 104 or stacked on top of one another.

As used herein, a 3D printing process refers to a printing process in which layers of material are sequentially deposited in locations by a 3D print head such that the material extends in a printing direction defined by the movement of the 3D print head. The movement of the 3D print head is controlled according to a 3D model by a computer, for example. A 3D printing process does not involve molding as the 3D print head gradually releases a liquid material that hardens under different conditions outside of the print head.

Examples of different conditions used to harden liquid material include a temperature gradient or a variation in radiation, such as light. In other words, in a 3D printing process, features of the 3D structure are deposited and hardened at different time intervals.

The non-conductive components of the packaging assembly 102 (e.g. the substrate 100 and the protective covering 126) may be formed from a thermoplastic, for example. A thermoplastic is ideally suited for 3D printing as it is easily formable at high temperatures and hardens upon cooling. Exemplary thermoplastics include ABS (acrylonitrile-butadiene-styrene) and PLA (polylactic acid). Filler materials may be provided with the thermoplastic to achieve a desired attribute, such as durability, dielectric constant, etc. Further, the 3D printing process can be controlled so that these non-conductive components are porous. That is, the non-conductive components can be formed to include voids in the material. These porous structures may be advantageously used in applications that require a degree of passivity in the protective covering 126 so that gas or fluid can pass to the semiconductor module 114 while dust particles are repelled. The conductive components of the packaging assembly 102 (e.g. the conductive contact pads 110 and the conductive wires 124) may be formed from an electrically conducting thermoplastic, such as a ABS or PLA combined with silver (Ag) Alternatively, the conductive components of the packaging assembly may be formed by selective laser sintering of metal powders.

The packaging assembly 102 may be formed by the following sequence. First, a 3D print head forms the conductive contact pads 110 and the substrate 100 as shown in FIG. 1. Next, the semiconductor module 114 is arranged on the substrate 100 between the conductive contact pads 110 as shown in FIG. 2. Next, a 3D print head forms the conductive wires 124 electrically connecting the conductive contact pads 110 to the connection terminals 122 on the first surface 116. Next, a 3D print head forms the protective covering 126. Alternatively, the substrate 100, conductive contact pads 110 and conductive wires 124 may be formed by conventional processes and only the protective covering 126 may be formed by 3D printing.

Figure 3:
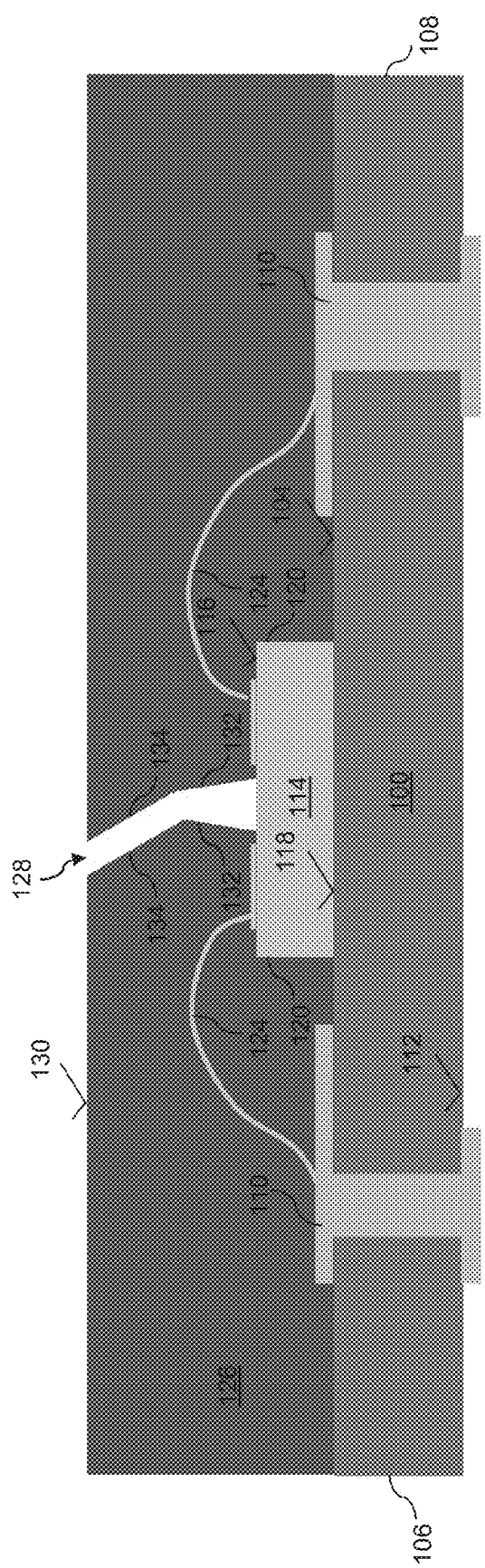
FIG. 3 depicts a packaging assembly having a negative taper in the protective covering, according to an embodiment.

FIG. 3 depicts a semiconductor packaging assembly 102 having a negative taper in the protective structure. The semiconductor packaging assembly 102 is identical to the packaging assembly 102 depicted in FIG. 2 in all aspects, except that the assembly 102 includes a first opening 128 extending from an outer surface 130 of the protective covering 126 to the first surface 116 of the semiconductor module 114. The first opening 128 has a negative taper.

A negative taper refers to an orientation of two opposing sidewalls in the protective covering 126 relative to a surface that the opposing sidewalls adjoin. A negative taper exists if the separation distance between the opposing sidewalls increases as the opposing sidewalls approach the adjoining surface. That is, the two opposing sidewalls are inclined with respect to the adjoining surface and extend away from the adjoining surface along planes that intersect.

In the embodiment depicted in FIG. 3, the first opening 128 has a first set of opposing sidewalls 132 that adjoin the first surface 116 of the semiconductor module 114 and form a negative taper with respect to the first surface 116. Additionally, the first opening 128 has a second set of opposing sidewalls 134 that extend from the outer surface 130 to the first set of opposing sidewalls 132.

The configuration of the protective covering 126 depicted in FIG. 3 may be beneficial in a MEMs application. Notably, the negative taper in the first set of opposing sidewalls 132 restricts the ability of particulates to pass through the first opening 128. Further, the first opening 128 is laterally offset between the outer surface 130 and the first surface 116 of the semiconductor module 114 such that the entire first surface 116 is covered in a direction perpendicular to the first surface 116. Thus, the protective covering 126 substantially protects the semiconductor module 114 and electrical connections from particulates. Nonetheless, the first opening 128 allows for a portion of the first surface 116 to be exposed to temperature and other atmospheric conditions.

Figure 4:
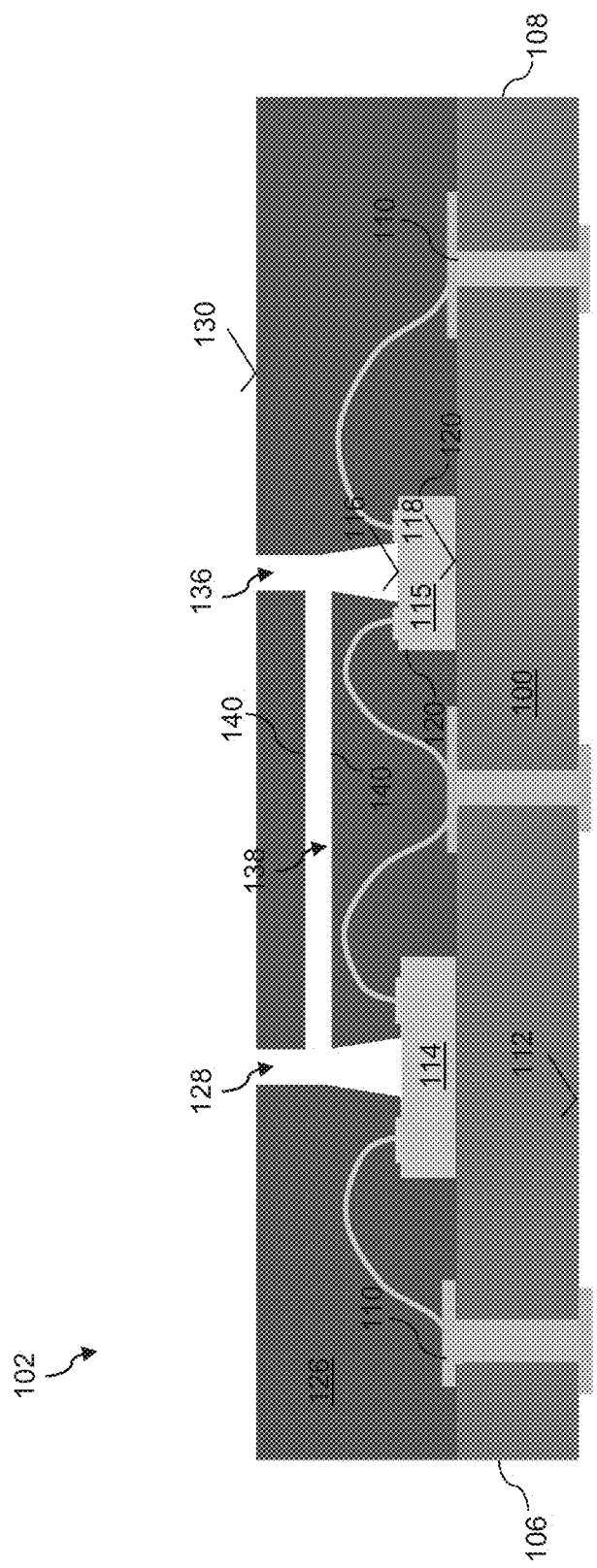
FIG. 4 depicts a packaging assembly having two semiconductor modules arranged on the substrate, openings in the protective covering extending to each of the semiconductor modules, and a channel in the protective covering extending between the openings, according to an embodiment.

FIG. 4 depicts a semiconductor packaging assembly 102 having a second semiconductor module 115. The second semiconductor module 115 is similar to the first semiconductor module 114 in that it has a first surface 116, a second surface 118 opposite the first surface 116 and edge sides 120 extending between the first surface 116 and the second surface 118. The second semiconductor module 115 is arranged on the substrate 100 adjacent the first semiconductor module 114 such that the second surface 118 of the second semiconductor module 115 faces the mounting surface 104. The protective covering 126 directly adjoins and extends over the first surface 116 of the second semiconductor module 115. The protective covering 126 comprises a second opening 136 that extends from the outer surface 130 of the protective covering 126 to the first surface 116 of the second semiconductor module 115.

According to an embodiment, the semiconductor packaging assembly 102 includes a channel 138 in the protective covering 126. The channel 138 is arranged between the outer surface 130 and the first surface 116 of the first and second semiconductor modules 114, 115 and extends from the first opening 128 to the second opening 136. The channel 138 has opposing sidewalls 140 that may be parallel to the first surface 116 of the first and second semiconductor modules 114, 115. Alternatively, the opposing sidewalls 146 of the channel 134 may be inclined with respect to the first surface 116 of the first and second semiconductor module 114, 115 and may be non-parallel to one another. The arrangement of the channel 134 may be beneficial in a MEMs application by providing a differential connection between two or more MEMs sensors. That is, atmosphere, temperature, the presence of liquids or gas and other environmental conditions detected by each of the MEMs sensors are not completely independent from one another.

All of the shapes in the protective covering 126 depicted in FIGS. 3-4 are made possible by forming the protective covering 126 using a 3D printing process. That is, the shapes depicted in FIGS. 3-4 are exemplary configurations of a protective covering 126 that is difficult or impossible to achieve by a molding process because the fluid, high temperature encapsulant material tends to harden before reaching the contours of a mold cavity corresponding to the first opening 128 in a mold cavity. However, 3D printing can easily form these angled surfaces because the material is sequentially deposited and hardened. That is, a 3D printing process does not involve molding. Further, the shapes in the protective covering 126 depicted in FIGS. 3-4 can be easily modified to meet the requirements of a particular application. For example, the angle of the second set of opposing sidewalls 134 with respect to the first surface 116 and the degree of negative taper in the first set of opposing sidewalls 132 can be easily adjusted.

Figure 5:
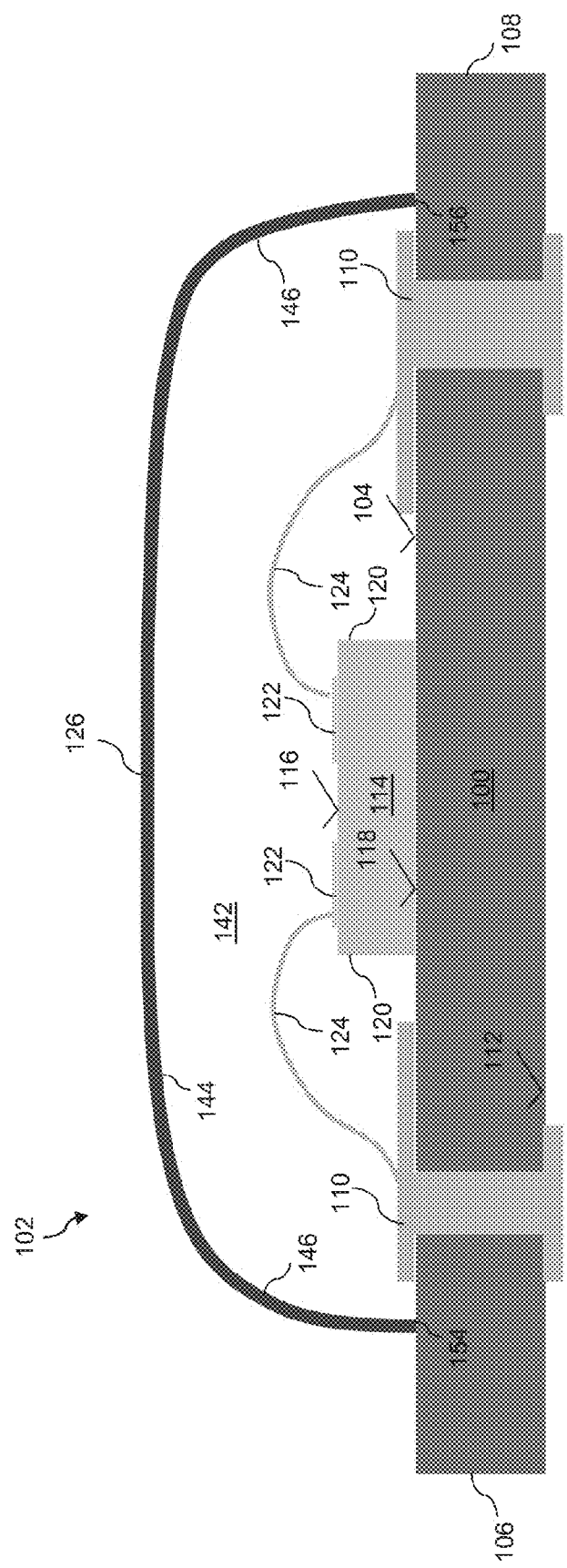
FIG. 5 depicts a packaging assembly having a protective covering formed as a 3D printed layer around the semiconductor module such that the that the semiconductor module is arranged in a cavity defined by the 3D printed layer, according to an embodiment.

FIG. 5 depicts a semiconductor packaging assembly 102 in which the protective covering 126 is formed as a printed 3D layer that is spaced apart from the semiconductor module 114. As used herein, a printed 3D layer refers to a complete structure formed by a succession of depositing and hardening. In other words, a printed 3D layer does not refer to the individual component layers formed by a 3D print head that collectively form a desired structure.

The protective covering 126 forms a cavity 142 around the first semiconductor module 114 defined by an inner surface 144 of the protective covering 126 and the mounting surface 104. The protective covering 126 includes a set of opposing sidewalls 146 adjoining first and second portions of the mounting surface 104. The opposing sidewalls 146 form a negative taper with respect to the mounting surface 104. That is, the protective covering 126 depicted in FIG. 5 provides a cavity 142 having a negative taper.

Figure 6:
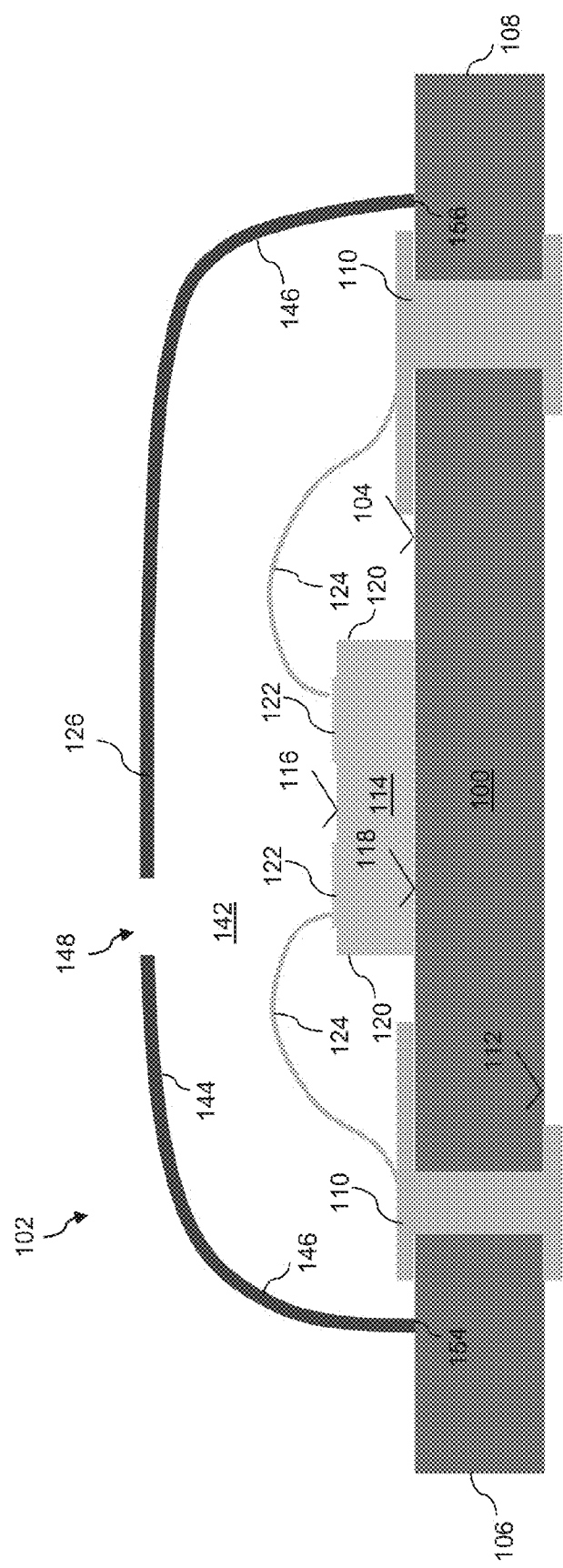
FIG. 6 depicts the packaging assembly of FIG. 5 having an opening in the protective covering, according to an embodiment.

Referring to FIG. 6, the protective covering 126 may be formed to include a first opening 148 spaced apart from the first surface 116. The first opening 148 may be arranged directly over the first surface 116, or may be horizontally offset from the first surface 116.

Figure 7:
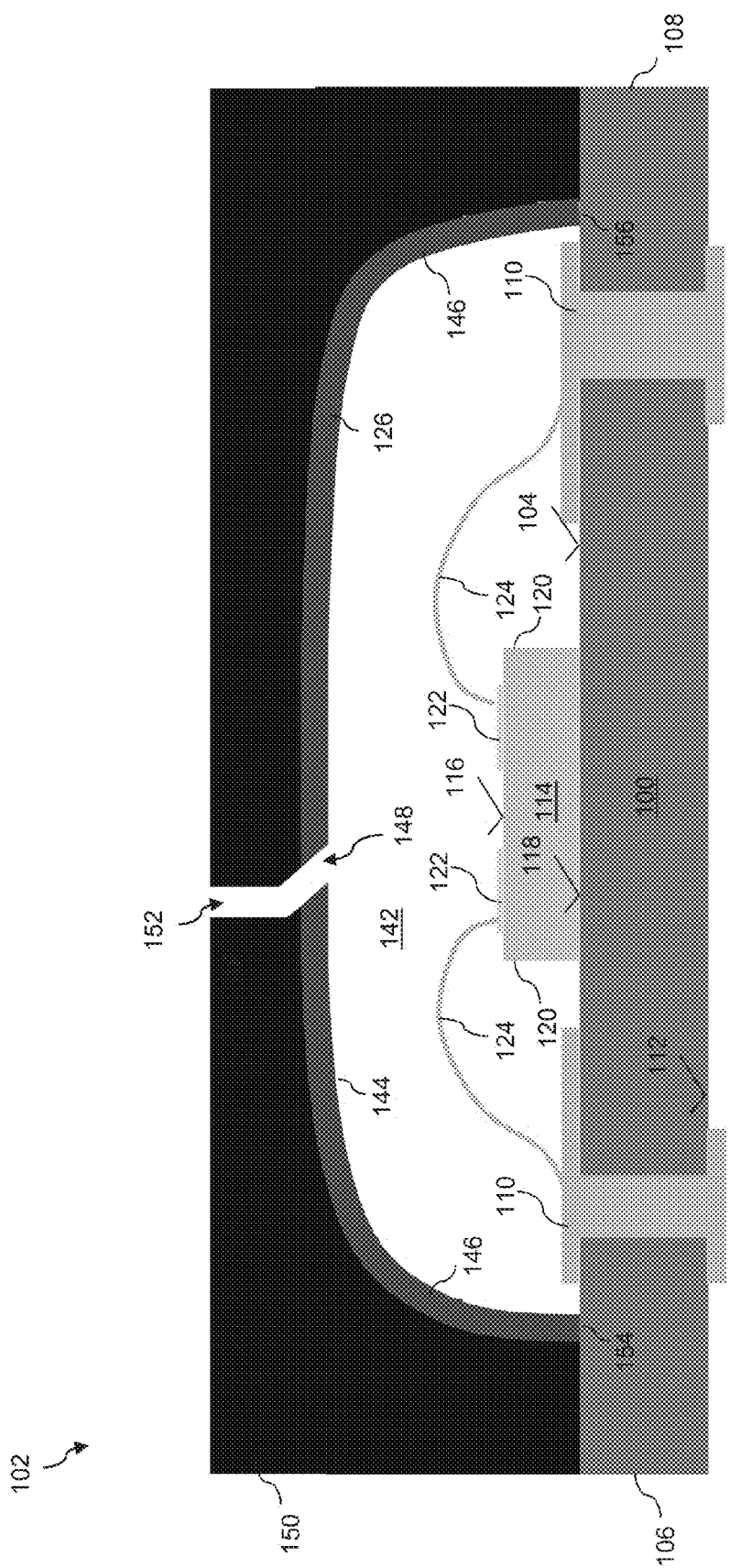
FIG. 7 depicts an overmold structure formed around the protective covering of FIG. 6, according to an embodiment.

Referring to FIG. 7, an overmold structure 150 may be formed over the protective covering 126. The overmold structure 150 adjoins the protective covering 126 and the mounting surface 104 of the substrate 100. The overmold structure 150 may include a second opening 152 that is aligned with the first opening 148 of the protective covering 126.

Collectively, the overmold structure 150 and the protective covering 126 depicted in FIG. 7 provide a durable housing that surrounds and protects the semiconductor module 114. One notable advantage of the arrangement depicted in FIG. 7 is that the protective covering 126 separates the conductive wires 124 from the molded encapsulant material of the overmold structure 150. Thus, protective coating and other process steps used to protect the conductive wires 124 from stress applied by the encapsulate material are not necessary. Furthermore, the arrangement of the first and second openings 148, 152 in the overmold structure 150 and the protective covering 126 beneficially protects the semiconductor module 114 from particulates while exposing the semiconductor module 114 to the exterior atmosphere. As shown in FIG. 7, the first opening 148 in the protective covering 126 is angled with respect to the second opening 152 in the overmold structure 150, which restricts particles from entering the packaging structure.

In the semiconductor packaging assemblies 102 depicted of FIGS. 5-7, the protective covering 126 may be formed by the 3D printing process described herein. Referring to FIG. 5, the protective covering 126 may be formed by the following sequence. First, a 3D layer is printed on a first portion 154 of the mounting surface 104 between one of the conductive contact pads 110 and a first edge 106 of the substrate 100. Subsequently, the 3D layer is extended over the first surface 116 of the semiconductor module 114. Subsequently, the 3D layer is printed on a second portion 156 of the mounting surface 104 between one of the conductive pads and a second edge 108 of the substrate 100 that is opposite the first edge 106. In other words, the protective covering 126 is formed on the first portion 154 and the second portion 156 at different times. The protective covering 126 may be built in a continuous sequence such the 3D print head starts printing on the first portion 154 and ends at the second portion 156.

Referring to FIG. 6, the protective covering 126 may be formed by the same sequence as described above with reference to FIG. 5, except that the 3D printing process is interrupted after extending the 3D layer over the first surface 116 of the semiconductor module 114. Subsequently, the 3D layer is printed on the second portion 156 and extended over the first surface 116 such that the 3D layer comprises a first opening 148 spaced apart from the first surface 116. That is, the 3D layer is not continuously printed around the semiconductor module 114.

Referring to FIG. 7, the overmold structure 150 may be formed by a molding process. The molding process may be a commonly known molding process in which a mold cavity is provided around the protective covering 126 and encapsulant material (in a fluid state) is poured into the mold cavity and hardened.

The combination of 3D printing and molding described above offers significant advantages over forming a housing or protective covering 126 exclusively by molding. For example, the arrangement of the first opening 148 is not limited by the capabilities of a molding process. That is, the interior shapes of the packaging assembly 102 are within the realm of anything that can be created by a 3D printing process. Nonetheless, the benefits of a molded structure, such as density, rigidity, etc. can still be realized by providing the overmold structure 150 around the 3D printed protective covering 126.

Figure 8:
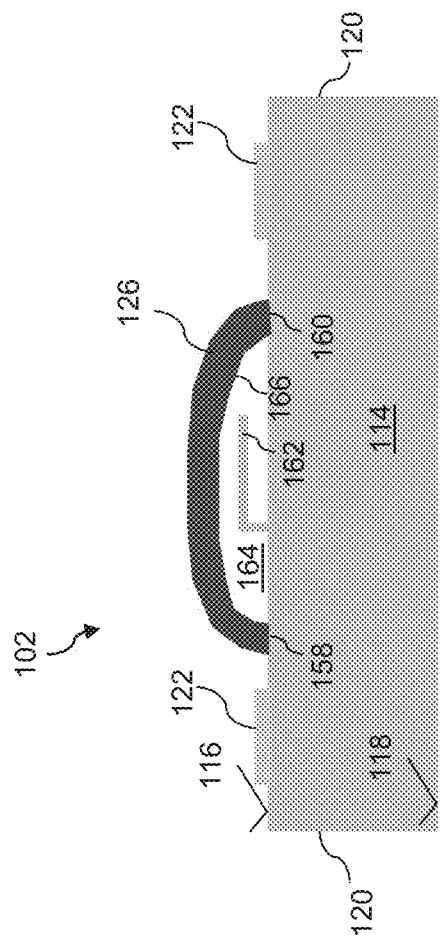
FIG. 8 depicts a packaging assembly having a protective covering formed directly on the surface of a semiconductor module such that a portion of the surface of the semiconductor module is arranged in a cavity, according to an embodiment.

Referring to FIG. 8, a semiconductor packaging assembly 102 in which the protective covering 126 is formed directly on the semiconductor module 114 is depicted. The protective covering 126 adjoins the first surface 116 at a first location 158 and a second location 160. Each of the first and second locations 158, 160 are spaced apart from the edge sides 120 of the semiconductor module 114 such that portions of the first surface 116 adjacent the edge sides 120 are exposed from the protective covering 126. That is, the protective covering 126 is formed exclusively on a portion of the first surface 116 and does not extend to the edge sides 120 of the semiconductor module 114. The semiconductor packaging assembly 102 may optionally include other components previously discussed (e.g. a substrate 100 and conductive wires 124). However, the protective covering 126 does not extend over or adjoin these components.

A first MEMs device 162 is arranged on the first surface 116 between the first and second locations 158, 160. Thus, the protective covering 126 surrounds the first MEMs device 162 while leaving other portions of the semiconductor module 114 exposed. The MEMs device 162 may be any device utilized in MEMs applications, such as an oscillator or sensor. Examples of common MEMS sensors are gas sensors, pressure sensors and acceleration sensors.

As shown in FIG. 8, the semiconductor module 114 may include external connection terminals 122 that are arranged outside of the protective covering 126 between the first and second locations 158, 160 and the edge sides 120 of the semiconductor module 114. Thus, the protective covering 126 does not inhibit the bonding of wires to the external connection terminals 122.

The MEMs device 162 depicted in FIG. 8 is arranged in a first cavity 164 provided by the protective covering 126. The first cavity 164 is defined by an inner surface 166 of the protective covering 126 and a portion of the first surface 116 between the first and second locations 158, 160. That is, the MEMs device 162 is completely enclosed by the protective covering 126.

Figure 9A:
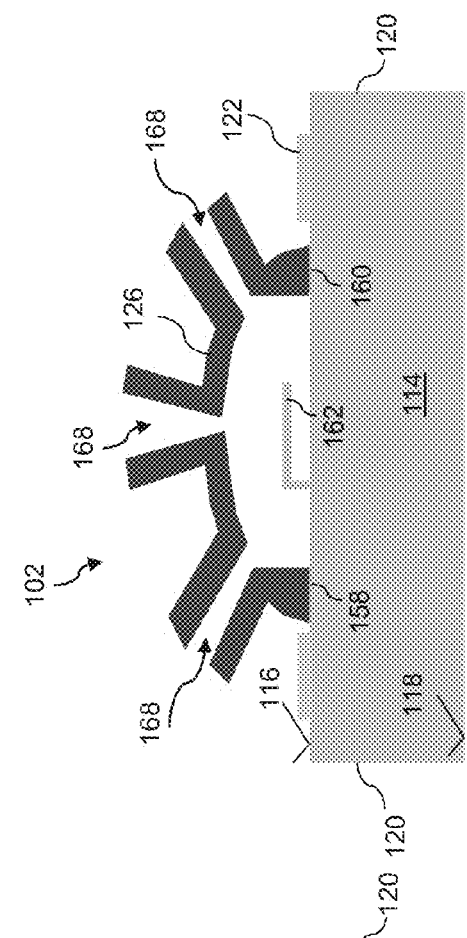
FIGS. 9A-9C depicts various protective coverings formed directly on the surface of a semiconductor module having an opening that exposes a MEMs device and having sidewall features that protect the MEMs device, according to an embodiment.
Figure 9B:
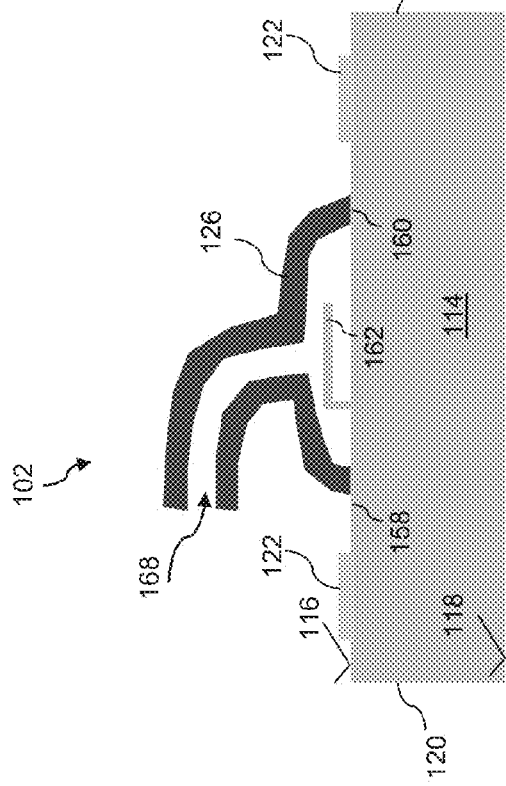
Figure 9C:
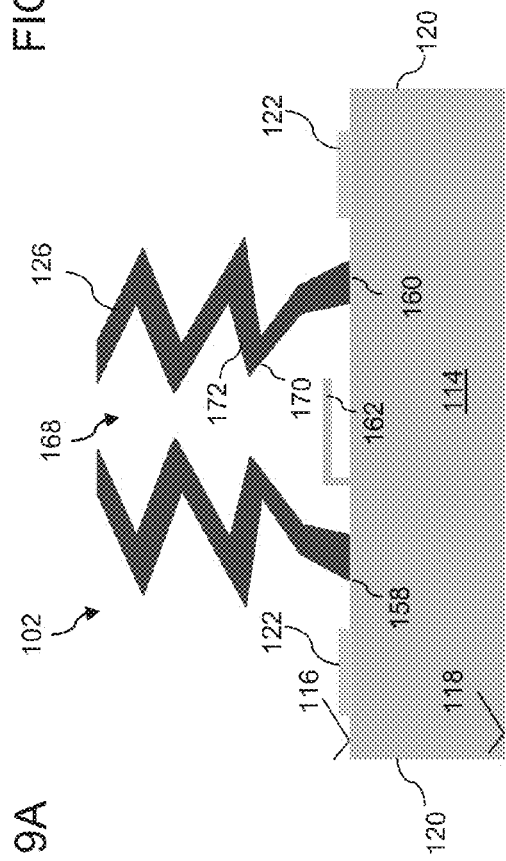

Referring to FIG. 9, various embodiments of a protective covering 126 formed directly on the semiconductor module 114 are depicted. As shown in FIG. 9A, the packaging assembly 102 is substantially similar to the packaging assembly 102 depicted in FIG. 8, except that an opening 168 is included in the protective structure. Referring to FIG. 9B, the protective covering 126 has three openings 168. Referring to FIG. 9C, the protective covering 126 includes a retrograde shape.

A retrograde shape refers to an orientation of two surfaces in the protective covering 126, which adjoin one another at an angle, and extend away from the first surface 116 of the semiconductor module 114. A retrograde shape exists if one of the surfaces forming an angle extends away from the first surface 116 at an angle of less than ninety degrees and the other surface forming an angle extends away from first surface 116 at an angle of more than ninety degrees. That is, both surfaces in the protective covering 126 are inclined with respect to the first surface 116 and one surface reverses the incline of the other, past the point of perpendicularity to the first surface 116. The protective covering 126 depicted in FIG. 9C includes two surfaces 170, 172 adjoining one another at an angle and extending away from the first surface 116 of the semiconductor module 114 to form a retrograde shape relative to the first surface 116.

Figure 10:
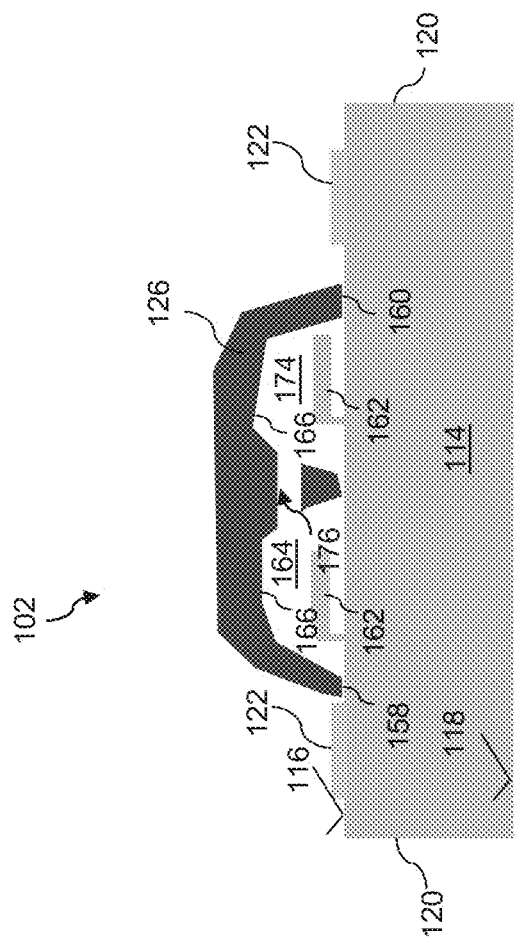
FIG. 10 depicts a protective covering formed directly on the surface of a semiconductor module such that a plurality of MEMs devices are arranged in different cavities and such that a channel extends between the cavities, according to an embodiment.

Referring to FIG. 10, a semiconductor packaging assembly 102 for a semiconductor module 114 having a plurality of MEMs devices 162 is shown. The first semiconductor module 114 is substantially similar to the semiconductor module 114 of FIGS. 7-10, except that it includes a second MEMs device 162 arranged between the first and second locations 158, 160. The second MEMs device 162 is arranged in a second cavity 174 that is spaced apart from the first cavity 164 and defined by an inner surface 166 of the protective covering 126 and a portion of the first surface 116 between the first and second locations 158, 160. A channel 176 is provided in the protective covering 126 extending from the first cavity 164 to the second cavity 168. According to an embodiment, opposing sidewalls of the channel 176 are substantially parallel to the first surface 116. Alternatively, the opposing sidewalls may be inclined with respect to the first surface 116, and may be non-parallel to one other.

The protective covering 126 depicted in FIGS. 8-10 may be formed by the 3D printing process previously described. For example, referring to FIG. 8, the protective covering 126 may be formed by printing a 3D layer extending from the first and second locations 158, 160 on the first surface 116 of the semiconductor module 114 spaced apart from the edge sides 120 such that the protective covering 126 comprises a first cavity 164 defined by an inner surface 166 of the 3D layer and a portion of the first surface 116. Referring to FIG. 9, the protective covering 126 may be formed by printing a 3D layer extending from first and second locations 158, 160 on the first surface 116 of the semiconductor module 114 spaced apart from the edge sides 120 such that protective covering 126 comprises an opening 168 spaced apart from the first surface 116.

The protective covering 126 depicted in FIGS. 8-10 are exemplary 3D printed layers that may be formed directly on the first surface 116 of the semiconductor module 114. The 3D printing process may be utilized to provide protective coverings 118 having some of the advantageous attributes previously discussed. For example, the retrograde shape depicted in FIG. 9C significantly can be used to provide a very narrow opening to the MEMS device that could not be produced by a molding process.

Figure 11:
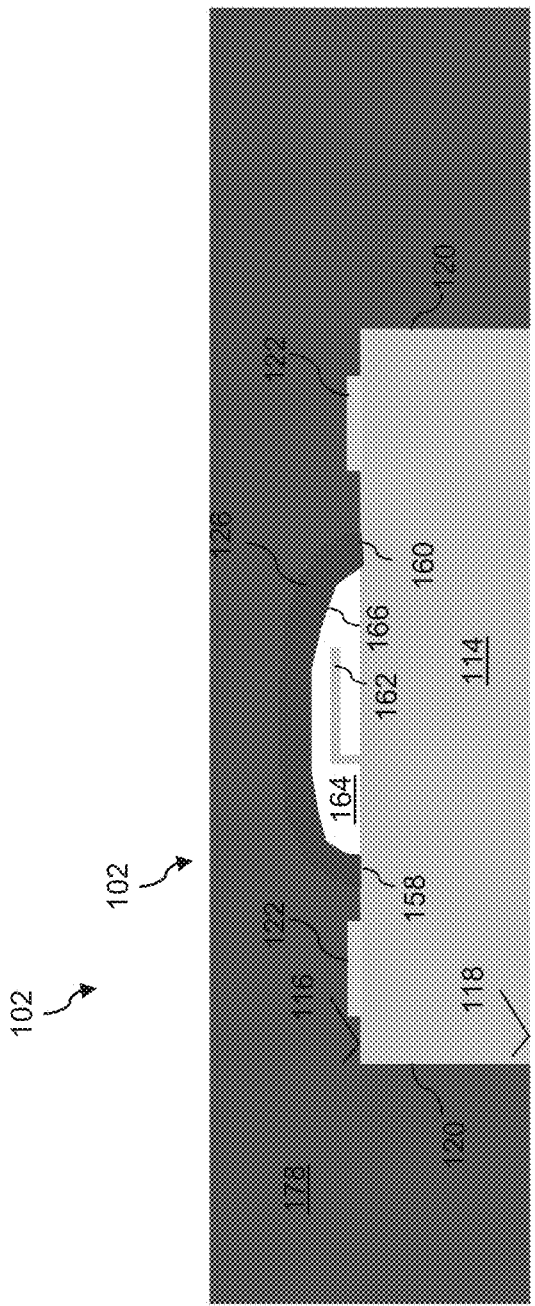
FIG. 11 depicts a protective covering formed directly on the surface of a semiconductor module and an overmold structure formed around the protective covering, according to an embodiment.

Advantageously, the 3D printing process may be used to produce the protective covering 126 directly on the first surface 116 of the semiconductor module 114 during chip-level fabrication. That is, in the embodiments depicted in FIGS. 8-10, the protective covering 126 may be produced at the wafer level, before singulation of semiconductor chips. Referring to FIG. 11, after wafer level fabrication of the protective covering 126, an overmold structure 178 may be produced around the protective covering 126. The combination of 3D printing with an overmold structure 178 may produce similar benefits as previously discussed with reference to the overmold structure 150 depicted in FIG. 8.

FIGS. 1-11 depict cross-sectional views of the packaging assembly 102 to illustrate the presently disclosed methods and corresponding structures. The cross-sectional perspective of these figures does not necessarily represent every cross-section of the packaging assembly 102. For instance, the first and second openings 128, 136 and the channel 138 depicted in FIG. 4 may be only arranged in a portion of the protective covering 126 aligned with the first and second semiconductor modules 114, 115. In other words, the protective structure 126 may be a continuous structure.

Spatially relative terms such as "under," "below," "lower," "over," "upper" and the like, are used for ease of description to explain the positioning of one element relative to a second element. These terms are intended to encompass different orientations of the package in addition to different orientations than those depicted in the figures. Further, terms such as "first," "second," and the like, are also used to describe various elements, regions, sections, etc. and are also not intended to be limiting. Like terms refer to like elements throughout the description.

Directional terminology, such as "top," "bottom," "front," "back," "upper," "lower," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method of packaging a semiconductor module, the method comprising:
   providing a semiconductor module comprising a first surface, a second surface opposite the first surface and edge sides extending between the first surface and the second surface; and
   forming a packaging assembly at least partly by a 3D printing process, the package assembly comprising the semiconductor module and a protective covering that laterally extends over the first surface so as to cover at least a portion of the first surface, wherein the protective covering is formed by the 3D printing process, wherein forming the packaging assembly comprises forming the protective covering directly on the first surface of the semiconductor module by the 3D printing process, wherein the protective covering is formed by printing a 3D layer extending from first and second locations on the first surface and spaced apart from the edge sides of the semiconductor module such that the protective covering comprises a cavity defined by an inner surface of the 3D layer and a portion of the first surface, and wherein a portion of the 3D layer that laterally extends over the semiconductor module is spaced apart from the semiconductor module such that a region of the cavity between the semiconductor module and the portion of the 3D layer that laterally extends over the semiconductor module is devoid of material.

2. The method of claim 1, further comprising forming an overmold structure adjoining the protective covering by a molding process.

3. A method of packaging a semiconductor module, the method comprising:
  providing a semiconductor module comprising a first surface, a second surface opposite the first surface and edge sides extending between the first surface and the second surface; and
  forming a packaging assembly at least partly by a 3D printing process, the package assembly comprising the semiconductor module and a protective covering that laterally extends over the first surface so as to cover at least a portion of the first surface, wherein the protective covering is formed by the 3D printing process,
  wherein forming the protective covering comprises forming a retrograde shape in the protective covering, and
  wherein the portion of the 3D layer that laterally extends over the semiconductor module is formed to include an opening that exposes the semiconductor module to the exterior atmosphere.

4. A method of packaging a semiconductor module, the method comprising:
  providing a semiconductor module comprising a first surface, a second surface opposite the first surface and edge sides extending between the first surface and the second surface; and
  forming a packaging assembly at least partly by a 3D printing process, the package assembly comprising the semiconductor module and a protective covering that laterally extends over the first surface so as to cover at least a portion of the first surface, wherein the protective covering is formed by the 3D printing process,
  wherein forming the protective covering comprises forming a 3D layer that laterally extends over the semiconductor module and is spaced apart from the semiconductor module, and
  wherein the packaged semiconductor device is formed to include a cavity that is devoid of material between the semiconductor module and the portion of the 3D layer that laterally extends over the semiconductor module.

* * * * *